US007986171B2

(12) United States Patent
Wang et al.

(10) Patent No.: US 7,986,171 B2
(45) Date of Patent: Jul. 26, 2011

(54) MIXED-VOLTAGE I/O BUFFER

(75) Inventors: Chua-Chin Wang, Kaohsiung (TW); Wei-Chih Chang, Kaohsiung (TW); Tzung-Je Lee, Kaohsiung (TW); Kuo-Chan Huang, Tainan County (TW)

(73) Assignees: Himax Technologies Limited, Tainan County (TW); National Sun Yat-Sen University, Kaohsiung (TW)

( * ) Notice: Subject to any disclaimer, the term of this patent is extended or adjusted under 35 U.S.C. 154(b) by 79 days.

(21) Appl. No.: 12/289,132

(22) Filed: Oct. 21, 2008

(65) Prior Publication Data

US 2010/0097117 A1  Apr. 22, 2010

(51) Int. Cl.
*H03B 1/00* (2006.01)
(52) U.S. Cl. ....................................................... 327/108
(58) Field of Classification Search ........... 327/108–112
See application file for complete search history.

(56) References Cited

U.S. PATENT DOCUMENTS

2005/0248892 A1* 11/2005 Ajit ................................. 361/56
* cited by examiner

*Primary Examiner* — Lincoln Donovan
*Assistant Examiner* — Daniel Rojas
(74) *Attorney, Agent, or Firm* — Rabin & Berdo, P.C.

(57) ABSTRACT

A mixed-voltage input/output (I/O) buffer includes an output buffer circuit. The output buffer circuit includes an output stage circuit, a gate-tracking circuit and a floating N-well circuit. The output stage circuit includes stacked pull-up P-type transistors and stacked pull-down N-type transistors, in which a first P-type transistor of the stacked pull-up P-type transistors and a first N-type transistor of the stacked pull-down N-type transistors are coupled to an I/O pad. The gate-tracking circuit controls gate voltage of the first P-type transistor in accordance with a voltage of the I/O pad to prevent leakage current. The floating N-well circuit provides N-well voltages for an N-well of the first P-type transistor and an N-well of a second P-type transistor, controlling gate voltage of the first P-type transistor, of the gate-tracking circuit to prevent leakage current.

42 Claims, 4 Drawing Sheets

MIXED-VOLTAGE I/O BUFFER

BACKGROUND

1. Field of Invention

The present invention relates to a buffer circuit. More particularly, the present invention relates to a mixed-voltage tolerant input/output (I/O) buffer in a semiconductor integrated circuit.

2. Description of Related Art

Integrated circuits (IC) are capable of being used nowadays to perform a wide variety of tasks. By packing many circuits onto the chip or integrating different circuits for different applications into one device, the total capabilities of the IC can be thus increased. Although the capabilities of the IC can be increased, different circuits may be operated at different voltages. For example, a system memory utilizes a voltage of 3.3V and employs the same bus as the 5V circuit, or the chip outputting an output voltage of 5V drives another chip powered by a power voltage of 1.8V or 3.3V. Therefore, a mixed-voltage tolerant I/O buffer is a necessary interface for communication between signals with different voltage levels.

However, the conventional mixed-voltage I/O buffer, which has an output stage circuit consisting of one PMOS transistor and one NMOS transistor, is usually provided to transmit signals with limited voltage levels. If the mixed-voltage I/O buffer is used as an interface to transmit signals with high voltage level (e.g. 5V), the output stage circuit will suffer from problems such as gate-oxide overstress, hot-carrier degradation and unpredictable leakage currents. As a result, the semiconductor device will have reliability problems.

SUMMARY

In accordance with one embodiment of the present invention, a mixed-voltage input/output (I/O) buffer is provided. The mixed-voltage I/O buffer includes an output buffer circuit. The output buffer circuit includes an output stage circuit, a gate-tracking circuit and a floating N-well circuit. The output stage circuit includes stacked pull-up P-type transistors and stacked pull-down N-type transistors, in which a first P-type transistor of the stacked pull-up P-type transistors and a first N-type transistor of the stacked pull-down N-type transistors are coupled to an I/O pad. The gate-tracking circuit controls gate voltage of the first P-type transistor in accordance with a voltage of the I/O pad to prevent leakage current. The floating N-well circuit provides N-well voltages for an N-well of the first P-type transistor and an N-well of a second P-type transistor, controlling gate voltage of the first P-type transistor, of the gate-tracking circuit to prevent leakage current.

In accordance with another embodiment of the present invention, the mixed-voltage I/O buffer includes an output stage circuit and a dynamic gate bias generator. The output stage circuit includes stacked pull-up transistors and stacked pull-down transistors. The dynamic gate bias generator converts logic signals into corresponding bias voltages for the output stage circuit and includes a power supply level detecting circuit and a dynamic driving detecting circuit. The power supply level detecting circuit outputs a determining signal by detecting voltage level of an I/O power supply. The dynamic driving detecting circuit is coupled to the power supply level detecting circuit and provides a first gate bias for a first N-type transistor of the stacked pull-down transistors in accordance with the I/O power supply and the determining signal to prevent duty cycle distortion of the output stage circuit in a transmitting mode.

In accordance with yet another embodiment of the present invention, the mixed-voltage I/O buffer includes an input buffer circuit. The input buffer circuit includes a first inverter, a first voltage level limiting circuit, a first voltage level pull-up circuit, an input stage circuit, and a logic calibration circuit. The first inverter inverts an input signal to generate a first control signal. The first voltage level limiting circuit limits voltage level of an external signal to generate the input signal transmitted to the first inverter to prevent electrical overstress of the first inverter. The first voltage level pull-up circuit is controlled by the first control signal to pull up voltage level of the input signal inputted into the first inverter. The input stage circuit receives the first control signal to generate corresponding digital signals inputted into a core circuit. The logic calibration circuit calibrates voltage level of the first control signal when the first inverter mis-operates due to the input signal having a low voltage level.

In accordance with still another embodiment of the present invention, the mixed-voltage I/O buffer includes an output buffer circuit and an input buffer circuit. The output buffer circuit is used to buffer signals from a core circuit to an I/O pad in a transmitting mode and includes an output stage circuit, a dynamic gate bias generator, a gate-tracking circuit, and a floating N-well circuit. The output stage circuit includes stacked pull-up P-type transistors and stacked pull-down N-type transistors, in which a first P-type transistor of the stacked pull-up P-type transistors and a first N-type transistor of the stacked pull-down N-type transistors are coupled to the I/O pad.

The dynamic gate bias generator converts logic signals into corresponding bias voltages for the output stage circuit and includes a power supply level detecting circuit and a dynamic driving detecting circuit. The power supply level detecting circuit outputs a determining signal by detecting voltage level of an I/O power supply. The dynamic driving detecting circuit is coupled to the power supply level detecting circuit and provides a first gate bias for a second N-type transistor of the stacked pull-down N-type transistors in accordance with the I/O power supply and the determining signal to prevent duty cycle distortion of the output stage circuit.

The gate-tracking circuit controls gate voltage of the first P-type transistor in accordance with a voltage of the I/O pad to prevent leakage current. The floating N-well circuit provides N-well voltages for an N-well of the first P-type transistor and an N-well of a second P-type transistor, controlling gate voltage of the first P-type transistor, of the gate-tracking circuit to prevent leakage current.

The input buffer circuit is used to buffer signals from the I/O pad to the core circuit in a receiving mode and includes a first inverter, a first voltage level limiting circuit, a first voltage level pull-up circuit, an input stage circuit, and a logic calibration circuit. The first inverter inverts an input signal to generate a first control signal. The first voltage level limiting circuit limits voltage level of an external signal from the I/O pad to generate the input signal transmitted to the first inverter to prevent electrical overstress of the first inverter. The first voltage level pull-up circuit is controlled by the first control signal to pull up voltage level of the input signal inputted into the first inverter. The input stage circuit receives the first control signal to generate corresponding digital signals inputted into a core circuit. The logic calibration circuit calibrates voltage level of the first control signal when the first inverter mis-operates due to the input signal having a low voltage level.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE PREFERRED EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive.

Figure 1:
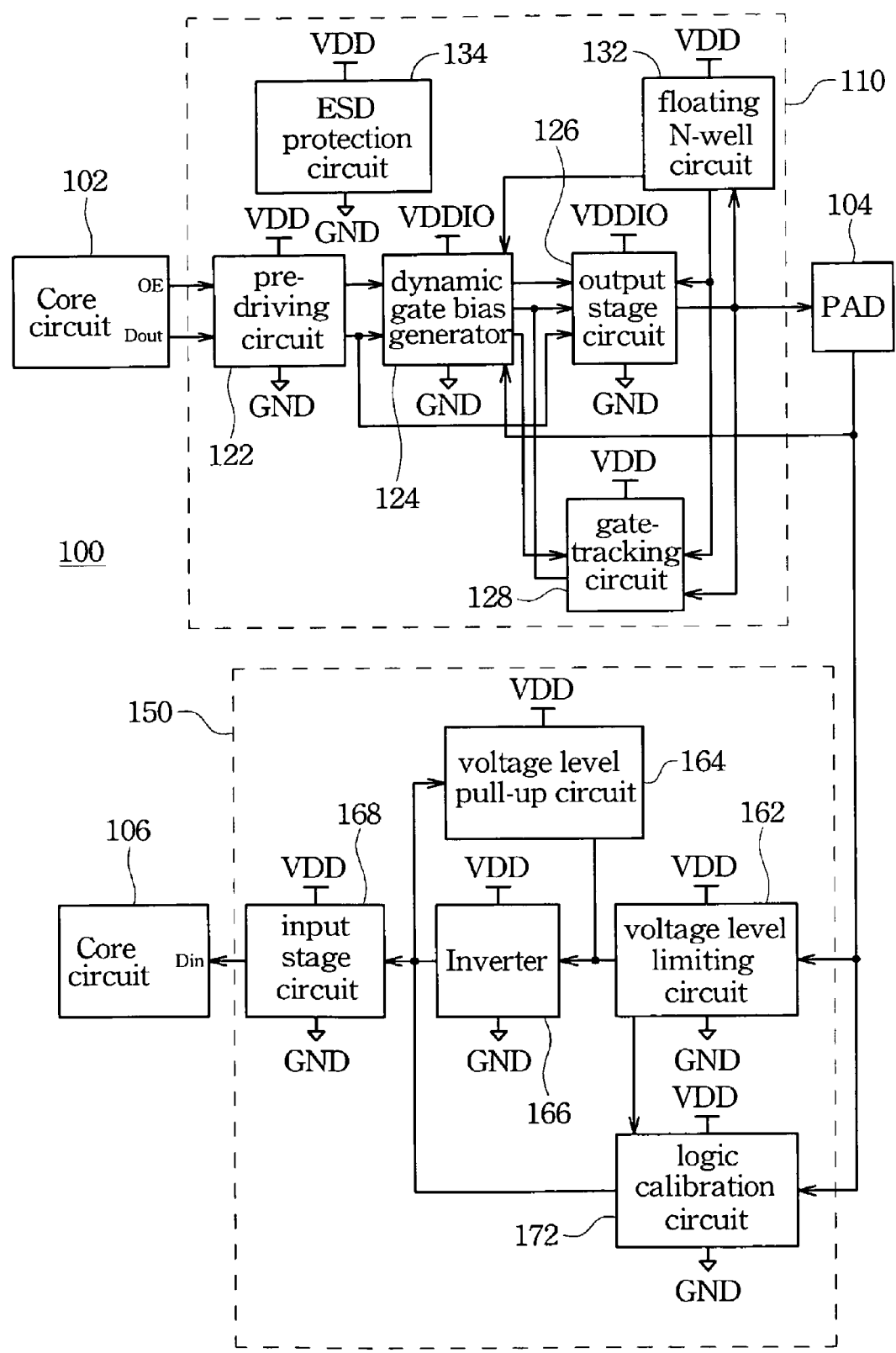
FIG. 1 illustrates a block diagram of the mixed-voltage input/output (I/O) buffer according to one embodiment of the present invention.

FIG. 1 illustrates a block diagram of the mixed-voltage input/output (I/O) buffer according to one embodiment of the present invention. The mixed-voltage I/O buffer 100 mainly includes an output buffer circuit 110 and an input buffer circuit 150. The output buffer circuit 110 buffers signals from the core circuit 102 to an I/O pad 104 in the transmitting mode, such that the I/O pad 104 has the required voltage level. On the contrary, the input buffer circuit 150 buffers signals from the I/O pad 104 to the core circuit 106 in the receiving mode, such that the logic "1" can be, for example, converted into 3.3V, in which the core circuit 106 receiving the signals from the I/O pad 104 may be the same as or different from the core circuit 102 transmitting the signals to the I/O pad 104.

As illustrated in FIG. 1, the output buffer circuit 110 includes a pre-driving circuit 122, a dynamic gate bias generator 124, an output stage circuit 126, a gate-tracking circuit 128, a floating N-well circuit 132, and an electrostatic discharge (ESD) protection circuit 134. The pre-driving circuit 122 is a digital logic circuit capable of outputting logic signals and determining that the mixed-voltage I/O buffer 100 is operated in the transmitting mode or the receiving mode. The dynamic gate bias generator 124 receives the logic signals from the pre-driving circuit 122 and converts them into corresponding bias voltages to provide gate bias voltages for the output stage circuit 126 and to prevent problems such as distortion of duty cycle of the output signal, transistor reliability, and leakage current. The output stage circuit 126 can provide different driving currents in the transmitting mode according to N/PMOS transistors with different sizes therein.

The gate-tracking circuit 128 controls the gate voltage of the PMOS transistor in the output stage circuit 126 according to the voltage of the I/O pad 104 to prevent the PMOS transistor in the output stage circuit 126 from generating leakage current. The floating N-well circuit 132 controls N-well voltages of transistors in the output stage circuit 126 and the gate-tracking circuit 128, thereby preventing the leakage current generated when the parasitic diodes (e.g. P+/N-well diode) of the transistors are conducted and thereby preventing the transistors of the output stage circuit 126 from having body effects. The ESD protection circuit 134 releases ESD current when turned on, such that the output buffer circuit 110 can be protected against electrostatic discharge.

On the other hand, the input buffer circuit 150 includes a voltage level limiting circuit 162, a voltage level pull-up circuit 164, an inverter 166, an input stage circuit 168, and a logic calibration circuit 172. The voltage level limiting circuit 162 is provided to limit the voltage level of an external signal from the I/O pad 104 to generate an input signal transmitted to the inverter 166, so as to prevent the gate-oxide overstress in the inverter 166. The voltage level pull-up circuit 164 pulls up the rated voltage of the input signal transmitted through the inverter 166 to the input stage circuit 168. The inverter 166 inverts the input signal to generate a control signal transmitted to the input stage circuit 168 and controlling the input stage circuit 168 to turn on or off in the receiving mode. The input stage circuit 168 receives the control signal generated by the inverter 166 to generate a corresponding digital signal (e.g. high or low voltage level represented by logic "1" or "0") inputted into the core circuit 106. The logic calibration circuit 172 calibrates the voltage level of the control signal generated by the inverter 166 when the inverter 166 cannot determine the voltage level of the input signal and thus mis-operates due to the input signal having a too low voltage level.

Figure 2:
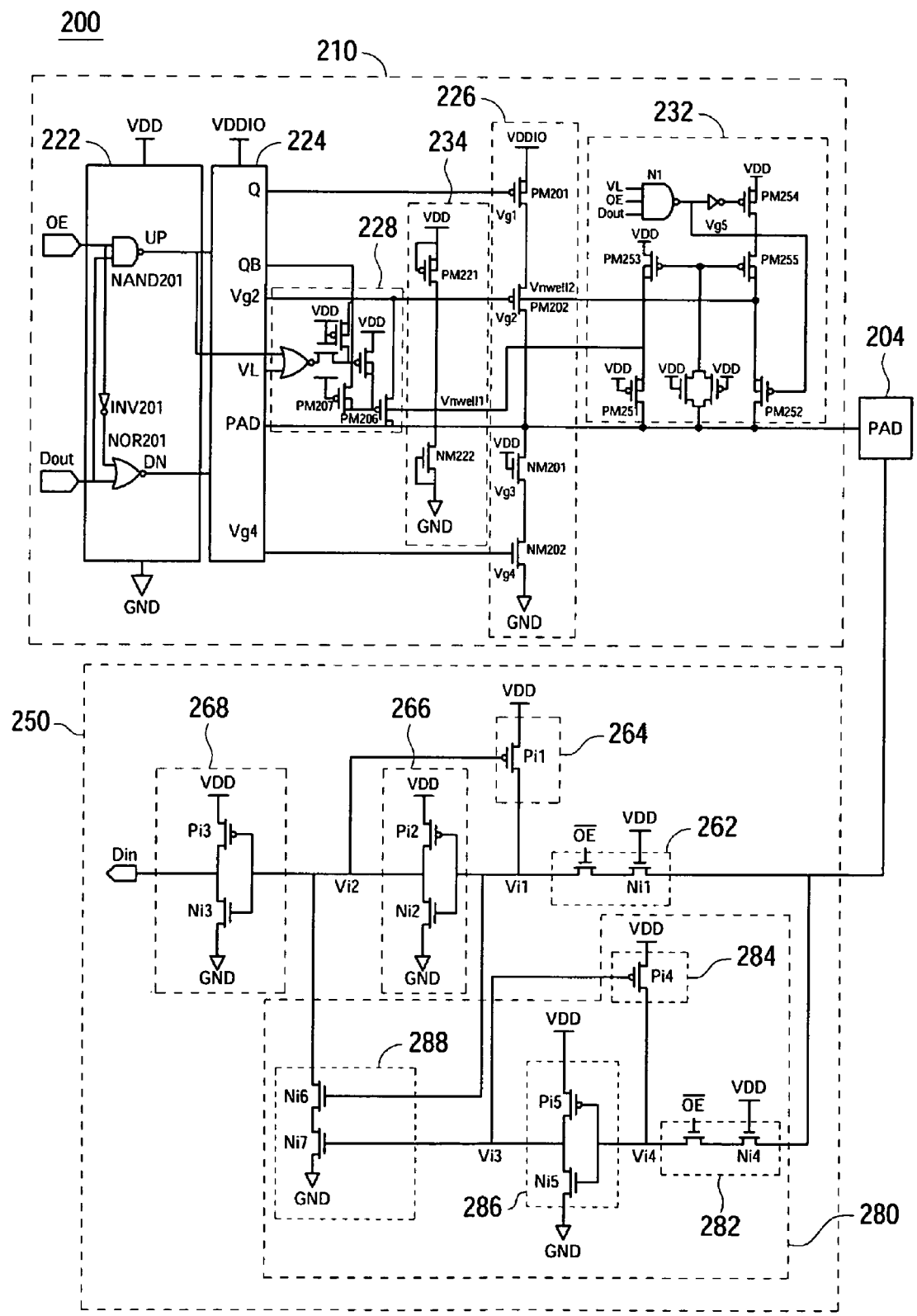
FIG. 2 illustrates a circuit diagram of the mixed-voltage I/O buffer according to one embodiment of the present invention.

FIG. 2 illustrates a circuit diagram of the mixed-voltage I/O buffer according to one embodiment of the present invention. As illustrated in FIG. 2, the mixed-voltage I/O buffer 200 comprises the output buffer 210 and the input buffer 250. In regard to the output buffer 210, the pre-driving circuit 222 functions to determine that the I/O buffer 200 is in the transmitting or receiving mode. The pre-driving circuit 222 further includes an NAND logic gate NAND201, an inverter INV 201, and an NOR logic gate NOR201, and also receives an enable signal (or control signal) OE and an output signal Dout. The enable signal OE is inputted into the NAND logic gate NAND201 and through the inverter INV 201 into the NOR logic gate NOR201. If the enable signal OE is logic "1", the I/O buffer 200 will operate in the transmitting mode; if the enable signal OE is logic "0", the I/O buffer 200 will operate in the receiving mode such that the signal having the same logic as which the I/O pad 204 has will be inputted into terminal Din.

Table I shows a truth table with two inputs (OE and Dout) and two outputs (UP and DN) of the pre-driving circuit 222. When OE is logic "0" (e.g. 0V), UP is logic "1" (e.g. 3.3V) and DN is logic "0" no matter what Dout is. At that moment, the I/O buffer 200 operates in the receiving mode and receives the external signal. On the contrary, when OE is logic "1", UP and DN change according to Dout. As shown in Table I, UP and DN are logic "1" when Dout is logic "0", and UP and DN are logic "0" when Dout is logic "1". At that moment, the I/O buffer 200 operates in the transmitting mode, and the signal from terminal Dout is transmitted to the I/O pad 204.

Since logic "1" is referred to as 3.3V (VDD) and logic "0" is referred to as 0V (GND), a voltage level converting circuit is thus required to convert 3.3V into 0.9~5V (the I/O power supply VDDIO) for logic "1" and to convert 0V into 0~2.5V (GND) for logic "0".

TABLE I

| Mode | OE | Dout | UP | DN |
|---|---|---|---|---|
| Receiving | 0 | 0 | 1 | 0 |
| | 0 | 1 | 1 | 0 |
| Transmitting | 1 | 0 | 1 | 1 |
| | 1 | 1 | 0 | 0 |

The output stage circuit 226 includes stacked pull-up PMOS transistors PM201 and PM202 and stacked pull-down NMOS transistors NM201 and NM202, in which PM202 and NM201 are further coupled to the I/O pad 204. When the I/O buffer 200 operates in the transmitting mode, N/PMOS transistors with different sizes are capable of providing various driving currents. Due to the co-existence of the stacked pull-up PMOS and the stacked pull-down NMOS, VDDIO can vary so as to change the level of the output voltage. Furthermore, the pre-driving circuit 222 and the dynamic gate bias generator 224 can control gate voltages of PM201 and PM202 to prevent PM201 and PM202 from suffering reliability problems, and the leakage current which may be caused by PM202 can be prevented by the gate-tracking circuit 228 and the floating N-well circuit 232.

Table II shows values of VDDIO and corresponding gate voltages (i.e. Vg1, Vg2, Vg3, Vg4) of transistors PM201, PM202, NM201, and NM202 in different operating modes.

TABLE II

| Mode | VDDIO | Vg1 | Vg2 | Vg3 | Vg4 |
|---|---|---|---|---|---|
| Receiving | 0.9 V | 0.9 V | 3.3/5 V* | 3.3 V | 0 V |
| | 1.2 V | 1.2 V | 3.3/5 V* | 3.3 V | 0 V |
| | 1.8 V | 1.8 V | 3.3/5 V* | 3.3 V | 0 V |
| | 2.5 V | 2.5 V | 3.3/5 V* | 3.3 V | 0 V |
| | 3.3 V | 3.3 V | 3.3/5 V* | 3.3 V | 0 V |
| | 5 V | 5 V | 3.3/5 V* | 3.3 V | 0 V |
| Transmitting (logic 1/0) | 0.9 V | 0/0.9 V | 0/3.3 V | 3.3 V | 0/0.9 V |
| | 1.2 V | 0/1.2 V | 0/3.3 V | 3.3 V | 0/1.2 V |
| | 1.8 V | 0/1.8 V | 0/3.3 V | 3.3 V | 0/1.8 V |
| | 2.5 V | 0/2.5 V | 0/3.3 V | 3.3 V | 0/2.5 V |
| | 3.3 V | 0/3.3 V | 0/3.3 V | 3.3 V | 0/3.3 V |
| | 5 V | >1.7/5 V | >1.7/3.3 V | 3.3 V | 0/3.3 V |

*$V_{PAD}$ = 5 V

In one embodiment, in the receiving mode, Vg1 is biased at voltage equal to VDDIO such that PM201 turns off, while Vg2, Vg3, and Vg4 are biased at 3.3V, 3.3V, and 0V, respectively. Notably, when $V_{PAD}$ is 5V, Vg2 should be pulled to 5V by the gate-tracking circuit 228 to avoid the leakage current path through PM202. In the transmitting mode, Vg1 and Vg2 are biased at 0V for VDDIO≦3.3V. Thus, logic "1" can be transmitted and the gate-oxide overstress is avoided. For transmitting logic "0", Vg4 is biased at the voltage equal to VDDIO for VDDIO≦3.3V.

The floating N-well circuit 232 provides appropriate N-well voltages (i.e. Vnwell2, Vnwell) for an N-well of PM202 in the output stage circuit 226 and an N-well of PM206, which controls gate voltage of PM202, in the gate-tracking circuit 228, so as to avoid that the parasitic diodes of PM202 and PM206 are conducted to generate unpredictable leakage currents and to prevent PM202 from having body effect. Vnwell2 can trace $V_{PAD}$ when transmitting logic "1", and Vnwell can trace $V_{PAD}$ in the receiving mode.

The floating N-well circuit 232 further includes PMOS transistors PM251-PM255 and an NAND gate N1. PM251 is coupled to the I/O pad 204 and the N-well of PM206 and turns on when the I/O pad 204 has a high voltage, such that the voltage of the I/O pad 204 is provided for the N-well of PM206. PM252 is coupled to the I/O pad 204 and the N-well of PM202 and turns on in accordance with the result of NAND operation of OE, Dout, and VL, in which VL is a determining signal described in the following, such that the voltage of the I/O pad 204 ($V_{PAD}$) is provided for the N-well of PM202. PM253 is coupled to the N-well of PM206, and the N-well of PM206 is biased at VDD through the parasitic diode of PM253 in the receiving mode. PM255 is coupled to the N-well of PM202 as well. PM254 is stack-connected with PM255 and turns on in the receiving mode to bias the N-well of PM202 at VDD through the parasitic diode of PM255. The NAND gate N1 is capable of performing NAND operation of OE, Dout, and VL and has an output coupled to PM255 and coupled to PM254 through an inverter.

In the transmitting mode, if the voltage of the output signal ranges between 0.9~3.3V and logic "1" is transmitted, the gate voltage of PM252 is biased at 0V, such that the N-well voltage Vnwell2 of PM202 in the output stage circuit 226 is the same as the voltages of the source and drain of PM202 and thus the body effect is eliminated. As a result, the driving ability of outputting high voltage level signals can be increased. At that moment, the N-well voltage Vnwell of PM206 in the gate-tracking circuit 228 is biased at 3.3V because the parasitic diode of PM253 is conducted. Besides, when a 5V signal is transmitted, the gate voltage of PM252 is 3.3V, and PM251 and PM252 both are turned on such that Vnwell and Vnwell2 are biased at 5V by $V_{PAD}$. As a result, the leakage currents through the parasitic diodes of PM202 and PM206 can be avoided.

In the receiving mode, the gate voltage of PM252 is 3.3V, PM254 is turned on, and the parasitic diodes of PM253 and PM255 are conducted, such that Vnwell and Vnwell2 are biased at 3.3V. If the 5V signal is received, PM251 and PM252 are turned on such that Vnwell and Vnwell2 are biased at 5V.

Table III shows corresponding voltage values of different signals (VL, OE, Dout, DN) and nodes (Vg5, Vnwell, Vnwell2) related to the floating N-well circuit 232.

TABLE III

| VL | OE | Dout | DN | Vg5 | Vnwell | Vnwell2 |
|---|---|---|---|---|---|---|
| 0 V | 0 V | 0 V | 0 V | 3.3 V | 5 V | 5 V |
| 0 V | 0 V | 3.3 V | 0 V | 3.3 V | 5 V | 5 V |
| 0 V | 3.3 V | 0 V | 3.3 V | 3.3 V | 5 V | 5 V |
| 0 V | 3.3 V | 3.3 V | 0 V | 3.3 V | 5 V | 5 V |
| 3.3 V | 0 V | 0 V | 0 V | 3.3 V | 3.3 V | 3.3 V |
| 3.3 V | 0 V | 3.3 V | 0 V | 3.3 V | 3.3 V | 3.3 V |
| 3.3 V | 3.3 V | 0 V | 3.3 V | 3.3 V | 3.3 V | 3.3 V |
| 3.3 V | 3.3 V | 3.3 V | 0 V | 0 V | 3.3 V | based on $V_{PAD}$ |

The gate-tracking circuit 228 is a tracking circuit which controls the gate voltage of PM202 based on the voltage of the I/O pad 204, so as to prevent PM202 from being turned on and generating leakage currents in the receiving mode. In the receiving mode, the gate-tracking circuit 228 would monitor $V_{PAD}$. When $V_{PAD}$ is 5V, PM206 is turned on such that Vg2 can be pulled up to 5V through PM206 such that the leakage current through PM202 can be thus prevented. In the transmitting mode, PM207 is turned on when VDDIO is 5V, such that the gate voltage of PM206 is biased at 5V and $V_{PAD}$ has no effect to Vg2.

Figure 3:
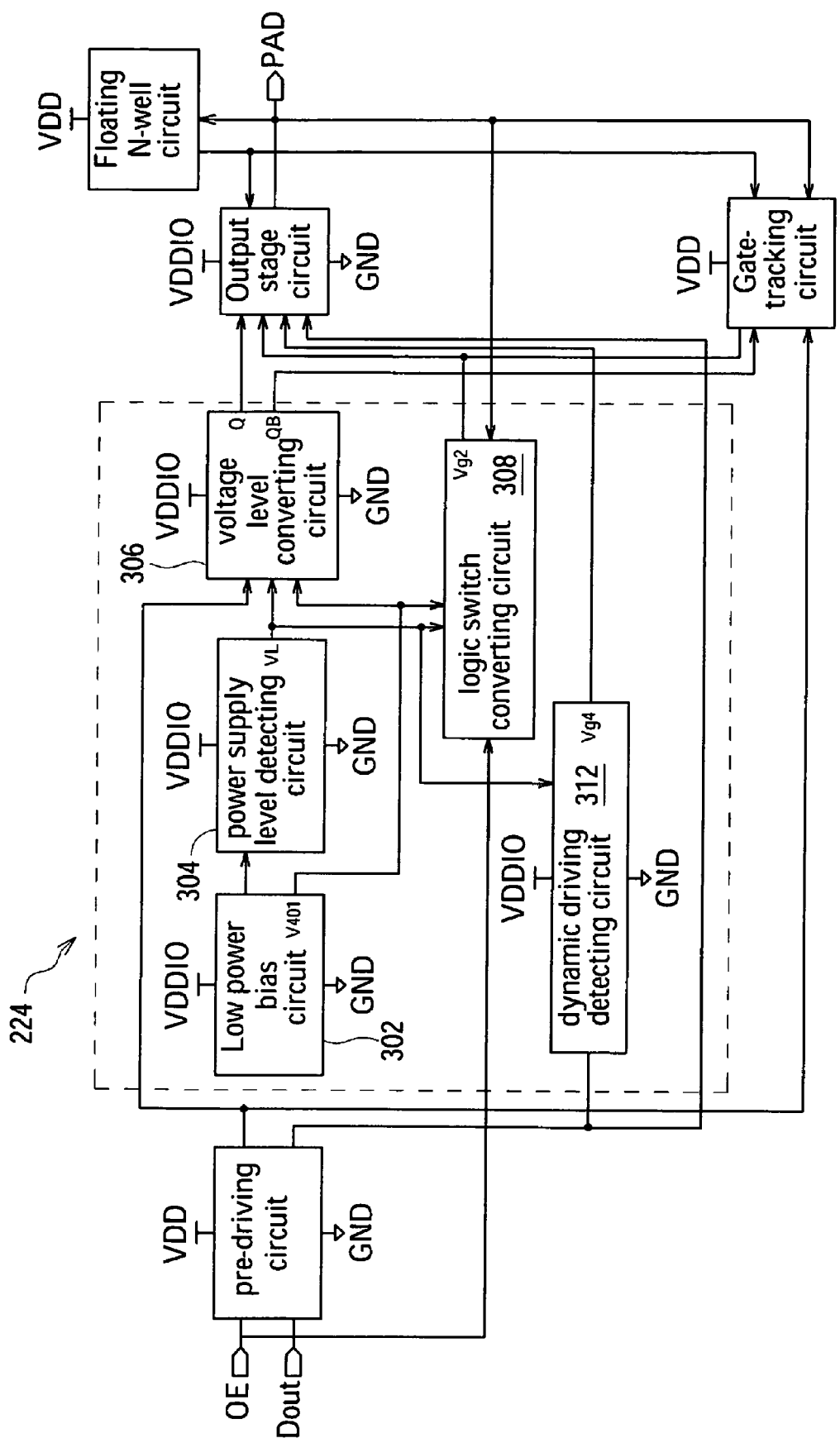
FIG. 3 illustrates a block diagram of the dynamic gate bias generator according to one embodiment of the present invention.

FIG. 3 illustrates a block diagram of the dynamic gate bias generator according to one embodiment of the present invention. The dynamic gate bias generator 224 includes a low-power bias circuit 302, a power supply level detecting circuit 304, a voltage level converting circuit 306, a logic switch converting circuit 308, and a dynamic driving detecting circuit 312. After receiving the signals from the pre-driving circuit, the low-power bias circuit 302 and the power supply level detecting circuit 304 generate the bias voltages and the determining signal, respectively, such that the voltage level converting circuit 306, the logic switch converting circuit 308, and the dynamic driving detecting circuit 312 can provide appropriate bias voltages for the output stage circuit based on the power supply VDDIO with different voltage levels, in order to make the output stage circuit operate normally within a wide range of voltages in different modes and make the gate-tracking circuit turn on and off appropriately to avoid problems such as distortion of duty cycle of output signals, leakage current, and reliability.

Figure 4:
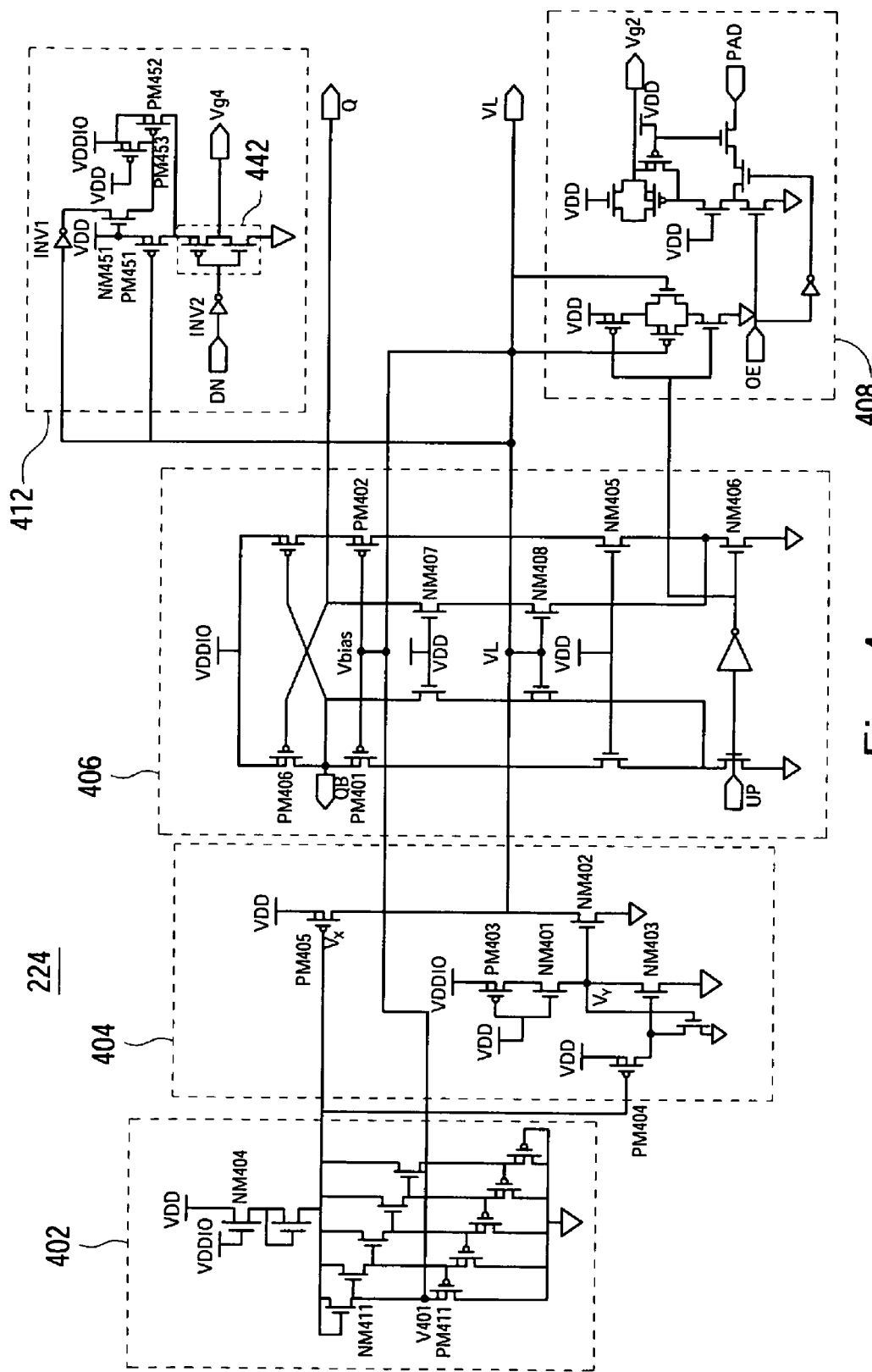
FIG. 4 illustrates a circuit diagram of the dynamic gate bias generator according to one embodiment of the present invention.

FIG. 4 illustrates a circuit diagram of the dynamic gate bias generator according to one embodiment of the present invention. The low-power bias circuit 402 provides a bias voltage $V_{bias}$ (e.g. 1.7V) for the transistors PM401 and PM402 in the voltage level converting circuit 406, such that when VDDIO is 5V, the voltage level of logic "0" at terminal Q can be pulled up to 2.5V so as to provide gate voltages for PM201 and PM202 in the output stage circuit to avoid reliability problems.

The low-power bias circuit 402 utilizes a circuit with closed-loop structure that transistors therein all operate in the sub-threshold region and the quiescent current thereof is minimized without any start-up circuit. Due to the characteristic that the transistor will turn on if the gate and source have a voltage difference larger than the threshold voltage, each transistor in the closed-loop circuit is turned off. For example, if the voltage of node V401 is too low, NM411 will turn on and charge node V401; if the voltage of node V401 is too high, PM411 will turn on and discharge node V401. Accordingly, the closed-loop circuit is configured such that the gate and source of each transistor have a voltage difference smaller than the threshold voltage and a stable bias voltage (e.g. 1.7V) can be provided from node V401 to the voltage level converting circuit 406.

The power supply level detecting circuit 404 determines if VDDIO is a high voltage signal (e.g. 5V) and generates the determining signal VL (also referring to node VL) transmitted to the voltage level converting circuit 406, the gate-tracking circuit 228 and the dynamic driving detecting circuit 412, so as to avoid overstress.

When VDDIO is 5V, PM403, NM401 and NM402 turn on such that the voltage of node VL is 0V, and PM404, NM403 and PM405 turn off at the same time because NM404 turns on. When VDDIO ranges between 0.9~3.3V, NM404, PM404, NM403 and PM405 turn on such that the voltage of node VL is 3.3V, and NM402 turns off at the same time.

The voltage level converting circuit 406 receives the low-power bias voltage $V_{bias}$ and the determining signal VL and outputs complementary signals Q and QB having corresponding voltage levels to VDDIO by converting voltage levels of UP. The voltage level converting circuit 406 converts 3.3V into 0.9~5V(VDDIO) for logic "1" and to convert 0V into 0~2.5V for logic "0" at terminal UP of the pre-driving circuit 222. When VDDIO is 5V and the signal at terminal UP is logic "0", NM405 and NM406 both turn on such that the voltage of node V401 and the gate voltage of PM402 both are 1.7V. Terminal Q is discharged to 2.5V by PM402, NM405 and NM406 such that PM406 turns on and terminal QB is charged to 5V. Similarly, when the signal at terminal UP is logic "1", terminal QB is discharged to 2.5V and terminal Q is charged to 5V.

On the other hand, when VDDIO ranges between 0.9~3.3V and the signal at terminal UP is logic "0", terminal Q is discharged to 0V by NM407, NM408 and NM406 such that PM406 turns on and terminal QB is charged to 0.9~3.3V. Similarly, when the signal at terminal UP is logic "1", terminal QB is discharged to 0V and terminal Q is charged to 0.9~3.3V. Table IV shows voltages of different nodes or terminals corresponding to various VDDIO in the voltage level converting circuit 406.

TABLE IV

| VDDIO | UP | VL | Q | QB |
|---|---|---|---|---|
| 5 V | 0 V | 0 V | 2.5 V | 5 V |
|  | 3.3 V |  | 5 V | 2.5 V |
| 3.3 V | 0 V | 3.3 V | 0 V | 3.3 V |
|  | 3.3 V |  | 3.3 V | 0 V |
| 2.5 V | 0 V | 3.3 V | 0 V | 2.5 V |
|  | 3.3 V |  | 2.5 V | 0 V |
| 1.8 V | 0 V | 3.3 V | 0 V | 1.8 V |
|  | 3.3 V |  | 1.8 V | 0 V |
| 1.2 V | 0 V | 3.3 V | 0 V | 1.2 V |
|  | 3.3 V |  | 1.2 V | 0 V |
| 0.9 V | 0 V | 3.3 V | 0 V | 0.9 V |
|  | 3.3 V |  | 0.9 V | 0 V |

The logic switch converting circuit 408 transmits the required bias voltage to PM202 in the output stage circuit 226 based on VDDIO. In the transmitting mode for logic "1", the logic switch converting circuit 408 converts 0V signal at terminal UP into 2.5V signal transmitted to terminal Vg2. When VDDIO is 5V in the transmitting mode for logic "0" or when VDDIO ranges between 0.9~3.3V, the logic switch converting circuit 408 transmits the signal, having the same voltage level as which terminal UP has, to terminal Vg2, so as to provide the appropriate bias voltage for the PMOS transistor in the output stage circuit 226.

The dynamic driving detecting circuit 412 (or VDDIO detector) provides the gate bias voltage Vg4 for NM202 in the output stage circuit 226 based on VDDIO and VL, so as to prevent duty cycle distortion caused by the decreased voltage difference between the gate and source of PMOS in the output stage circuit 226 when VDDIO is smaller than 3.3V.

The dynamic driving detecting circuit 412 includes PMOS transistors PM451, PM452 and PM453, an NMOS transistor NM451, inverters INV1 and INV2, and a CMOS circuit 442. PM451 has a gate receiving the determining signal VL and a source coupled to VDD and turned on by VL when VDDIO is a high voltage, such that VDD can be output through PM451 to be the gate bias Vg4. PM452 is coupled to VDDIO and turns on in accordance with VL when VDDIO is less than or equal to VDD such that VDDIO is output through PM452 to be the gate bias Vg4. PM453 has a gate coupled to VDD, a source coupled to VDDIO, and a drain coupled to the gate of PM452. NM451 has a gate coupled to VDD, a drain coupled to the output of INV1, and a source coupled to the gate of PM452. INV1 has an input receiving the determining signal VL and transmits the inverted signal to NM451. INV2 has an input receiving the logic signal DN and transmits the inverted signal to the CMOS circuit 442. The CMOS circuit 442 has an input coupled to the output of INV2 and an output for outputting the gate bias Vg4, in which the CMOS circuit 442 includes a pull-up transistor having a source coupled to drains of PM452 and PM451.

When VDDIO is 5V, VL is biased at 0V such that PM451 turns on and PM452 turns off and VDD (3.3V) is transmitted to terminal Vg4, i.e. gate of NM202, through PM451. When VDDIO ranges between 0.9V~3.3V, PM452 turns on and PM451 turns off such that Vg4 is pulled up to VDDIO through PM452. Therefore, the duty cycle of the output signal can be balanced.

Referring to FIG. 2 again, the ESD protection circuit is turned on to release the ESD current when the electrostatic discharge occurs, so as to increase the ESD protection ability of the I/O buffer 200. The transistors PM221 and NM222 are turned off when the I/O buffer 200 operates normally. When the electrostatic charge is generated, PM221 and NM222 are turned on to help increase the ESD ability of the I/O pad 204.

As illustrated in FIG. 2, the input buffer circuit 250 further includes the voltage level limiting circuit 262, the voltage level pull-up circuit 264, the inverter 266, the input stage circuit 268, and the logic calibration circuit 280. The voltage level limiting circuit 262 is activated by the control signal OE in the receiving mode to limit the voltage level of the external signal from the I/O pad 204 to generate the input signal Vi1. The inverter 266 inverts the input signal Vi1 to output the control signal Vi2 to control the input stage circuit 268. In the present embodiment, the input stage circuit 268 can be implemented by an inverter as well.

The logic calibration circuit 280 further includes a second voltage level limiting circuit 282, a second voltage level pull-up circuit 284, an inverter 286, and a pull-down calibration circuit 288. The second voltage level limiting circuit 282 is activated by OE in the receiving mode and limits the voltage level of the external signal from the I/O pad 204 to generate the input signal Vi4 transmitted to the inverter 286 to prevent electrical overstress of the inverter 286. The inverter 286 inverts the input signal Vi4 to generate a second control signal Vi3 for controlling the pull-down calibration circuit 288. The second voltage level pull-up circuit 284 pulls up the voltage level of the input signal Vi4 inputted into the inverter 286. The pull-down calibration circuit 288 is controlled by the input signal Vi1 and the second control signal Vi3 and pulls down the voltage level of the control signal Vi2 when the inverter 266 mis-operates due to the input signal Vi1 having a low voltage level.

The pull-down calibration circuit 288 includes NMOS transistors Ni6 and Ni7. Ni6 has a gate receiving the input signal Vi1 and a drain coupled to the output of the inverter 266 to receive the control signal Vi2. Ni7 has a gate receiving the second control signal Vi3, a drain coupled to the source of Ni6, and a source coupled to the ground voltage GND. When Ni6 is turned on by the input signal Vi1 which has the low voltage level and Ni7 is also turned on by the second control signal Vi3, the voltage level of the control signal Vi2 is pulled down to the ground voltage GND.

The input buffer circuit 250 transmits the received signal to the core circuit in the receiving mode and transforms logic "1" into 3.3V. In order to receive voltage signals between 0.9 V ~5V without any reliability problems, Ni1 is provided. The gate of Ni1 is connected to VDD (3.3V), so Pi2 and Ni2 do not have reliability problems when the high voltage signal (5V) is inputted from the I/O pad 204. Pi1 can pull up the voltage for logic "1" to VDD. When the input signal is logic "1" (0.9~5V), the control signal Vi2 outputted from the inverter 266 comprised of Pi2 and Ni2 is 0V, and Pi1 turns on and pulls up Vi1 to VDD to assure the inverter 266 of operating normally.

However, if the inverter 266 is comprised of transistors Pi2 and Ni2 fabricated with, for example, 0.35 µm process technologies, Vi2 will be 3.3V when Vi1 is 0.9V or 1.2V. As a result, the inverter 266 cannot determine the voltage level of the input signal correctly. Therefore, the logic calibration circuit 280 is thus provided to solve the problem. When the inverter 266 outputs the signal Vi2 with 3.3V based on the input signal Vi1 with 0.9V or 1.2V, Ni6 is turned on and Vi3 is also biased at 3.3V to turn on Ni7, such that Vi2 can be pulled down to 0V by Ni7 and the feedback loop including Pi1, Pi2 and Ni2. Then, the logic error can be resolved. Therefore, the input buffer 250 can operate normally to receive input signals from the I/O pad 204 with a wide range of voltage levels.

For the foregoing embodiments, the mixed voltage I/O buffer can be operated within a wide range of voltage levels, e.g. 0.9 to 5V, without problems such as gate-oxide overstress, hot-carrier degradation unpredictable leakage current paths, and body effect. The mixed voltage I/O buffer can output the signal with almost 50% duty cycle even with a 0.9V voltage level in 0.35 µm CMOS process. Furthermore, the static power consumption of the mixed voltage I/O buffer can be lowered to only 553 nW with the use of the low-power bias circuit.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A mixed-voltage input/output (I/O) buffer, comprising:
an output buffer circuit, comprising:
an output stage circuit comprising stacked pull-up P-type transistors and stacked pull-down N-type transistors, a first P-type transistor of the stacked pull-up P-type transistors and a first N-type transistor of the stacked pull-down N-type transistors being coupled to an I/O pad;
a gate-tracking circuit for controlling gate voltage of the first P-type transistor in accordance with a voltage of the I/O pad, the gate-tracking circuit including a second P-type transistor coupled between the gate of said first P-type transistor and said I/O pad to control said gate voltage; and
a floating N-well circuit for providing N-well voltages for an N-well of the first P-type transistor and an N-well of said second P-type transistor.

2. The mixed-voltage I/O buffer as claimed in claim 1, wherein the floating N-well circuit further comprises:
a third P-type transistor coupled to the I/O pad and the N-well of the first P-type transistor and turned on in accordance with a result of logical operation of an enable signal, a determining signal and an output signal, such that the voltage of the I/O pad is provided for the N-well of the first P-type transistor.

3. The mixed-voltage I/O buffer as claimed in claim 2, wherein the floating N-well circuit further comprises:
a fourth P-type transistor coupled to the N-well of the first P-type transistor; and
a fifth P-type transistor stack-connected with the fourth P-type transistor and turned on in a receiving mode to bias the N-well of the first P-type transistor at a power voltage through a parasitic diode of the fourth P-type transistor.

4. The mixed-voltage I/O buffer as claimed in claim 3, wherein the floating N-well circuit further comprises:
a logic circuit capable of performing NAND operation of the enable signal, the determining signal and the output signal, the logic circuit having an output coupled to the fourth P-type transistor and coupled to the fifth P-type transistor through an inverter.

5. The mixed-voltage I/O buffer as claimed in claim 1, wherein the floating N-well circuit further comprises:
a sixth P-type transistor coupled to the I/O pad and the N-well of the second P-type transistor and turned on when the I/O pad has a high voltage, such that the voltage of the I/O pad is provided for the N-well of the second P-type transistor.

6. The mixed-voltage I/O buffer as claimed in claim 5, wherein the floating N-well circuit further comprises:
a seventh P-type transistor coupled to the N-well of the second P-type transistor, the N-well of the second P-type transistor being biased at a power voltage through a parasitic diode of the seventh P-type transistor in a receiving mode.

7. The mixed-voltage I/O buffer as claimed in claim 1, wherein gates of the stacked pull-up P-type transistors are biased to prevent electrical overstress.

8. The mixed-voltage I/O buffer as claimed in claim 7, wherein the output buffer circuit further comprises:
a dynamic gate bias generator for converting logic signals into the bias voltages to bias the gates of the stacked pull-up P-type transistors.

9. The mixed-voltage I/O buffer as claimed in claim 8, wherein the output buffer circuit further comprises:
a pre-driving circuit outputting the logic signals to the dynamic gate bias generator by receiving an enable signal.

10. The mixed-voltage I/O buffer as claimed in claim 1, wherein the output buffer circuit further comprises:
an electrostatic discharge (ESD) protection circuit releasing ESD current when turned on.

11. A mixed-voltage input/output (I/O) buffer, comprising:
an output stage circuit comprising stacked pull-up transistors and stacked pull-down transistors; and
a dynamic gate bias generator for converting logic signals into corresponding bias voltages for the output stage circuit, the dynamic gate bias generator comprising:
a power supply level detecting circuit outputting a determining signal by detecting voltage level of an I/O power supply; and
a dynamic driving detecting circuit coupled to the power supply level detecting circuit, for receiving the determining signal from the power supply level detecting circuit, and providing a first gate bias for a first N-type transistor of the stacked pull-down transistors in accordance with the I/O power supply and the determining signal to prevent duty cycle distortion of the output stage circuit in a transmitting mode, wherein the dynamic driving detecting circuit further includes:
a first P-type transistor having a gate receiving the determining signal and a source coupled to a power voltage and turned on by the determining signal when the I/O power supply being at a high voltage such that the power voltage is output through the first P-type transistor to be the first gate bias:
a second P-type transistor coupled to the I/O power supply and turned on in accordance with the determining signal when the I/O power supply being less than or equal to the power voltage such that the I/O power supply is output through the second P-type transistor to be the first gate bias;
an inverter having an input receiving the determining signal; and
a second N-type transistor having a gate coupled to the power voltage, a drain coupled to an output of the inverter, and a source coupled to a gate of the second P-type transistor.

12. The mixed-voltage I/O buffer as claimed in claim 11, wherein the dynamic driving detecting circuit further comprises:
a third P-type transistor having a gate coupled to the power voltage, a source coupled to the I/O power supply, and a drain coupled to the gate of the second P-type transistor.

13. The mixed-voltage I/O buffer as claimed in claim 11, wherein the dynamic gate bias generator further comprises:
a voltage level converting circuit receiving a low-power bias and the determining signal and outputting complementary signals having corresponding voltage levels to the power supply by converting voltage levels of a second logic signal of the logic signals.

14. The mixed-voltage I/O buffer as claimed in claim 13, wherein the dynamic gate bias generator further comprises:
a logic switch converting circuit for providing a second gate bias for a fourth P-type transistor of the stacked pull-up transistors in accordance with voltage levels of the I/O power supply.

15. The mixed-voltage I/O buffer as claimed in claim 13, wherein the dynamic gate bias generator further comprises:
a low-power bias circuit for providing the low-power bias for the voltage level converting circuit.

16. The mixed-voltage I/O buffer as claimed in claim 11, further comprising:
a pre-driving circuit outputting the logic signals to the dynamic gate bias generator by receiving an enable signal.

17. A mixed-voltage input/output (I/0) buffer comprising:
an output stage circuit comprising stacked pull-up transistors and stacked pull-down transistors: and
a dynamic gate bias generator for converting logic signals into corresponding bias voltages for the output stage circuit, the dynamic gate bias generator comprising:
a power supply level detecting circuit outputting a determining signal by detecting voltage level of an I/O power supply; and
a dynamic driving detecting circuit coupled to the power supply level detecting circuit, for receiving the determining signal from the power supply level detecting circuit, and providing a first gate bias for a first N-type transistor of the stacked pull-down transistors in accordance with the I/O power supply and the determining signal to prevent duty cycle distortion of the output stage circuit in a transmitting mode, wherein the dynamic driving detecting circuit further includes:
a first P-type transistor having a gate receiving the determining signal and a source coupled to a power voltage and turned on by the determining signal when the I/O power supply being at a high voltage such that the power voltage is output through the first P-type transistor to be the first gate bias;
a second P-type transistor coupled to the I/O power supply and turned on in accordance with the determining signal when the I/O power supply being less than or equal to the power voltage such that the I/O power supply is output through the second P-type transistor to be the first gate bias;
an inverter having an input receiving a first logic signal of the logic signals; and
a CMOS circuit having an input coupled to an output of the inverter and an output for outputting the first gate bias, the CMOS circuit comprising a pull-up transistor having a source coupled to drains of the second P-type transistor and the first P-type transistor.

18. A mixed-voltage input/output (I/O) buffer, comprising:
an output buffer circuit for buffering signals from a core circuit to an I/O pad in a transmitting mode, comprising:
an output stage circuit comprising stacked pull-up P-type transistors and stacked pull-down N-type transistors, a first P-type transistor of the stacked pull-up P-type transistors and a first N-type transistor of the stacked pull-down N-type transistors being coupled to the I/O pad;
a dynamic gate bias generator for converting logic signals into corresponding bias voltages for the output stage circuit, the dynamic gate bias generator comprising:
a power supply level detecting circuit outputting a determining signal by detecting voltage level of an I/O power supply; and
a dynamic driving detecting circuit coupled to the power supply level detecting circuit and providing a first gate bias for a second N-type transistor of the stacked pull-down N-type transistors in accordance with the I/O power supply and the determining signal to prevent duty cycle distortion of the output stage circuit;
a gate-tracking circuit for controlling gate voltage of the first P-type transistor in accordance with a voltage of the I/O pad to prevent leakage current; and
a floating N-well circuit for providing N-well voltages for an N-well of the first P-type transistor and an N-well of a second P-type transistor, controlling gate voltage of the first P-type transistor, of the gate-tracking circuit to prevent leakage current; and
an input buffer circuit for buffering signals from the I/O pad to the core circuit in a receiving mode, comprising:
a first inverter for inverting an input signal to generate a first control signal;
a first voltage level limiting circuit for limiting voltage level of an external signal from the I/O pad to generate the input signal transmitted to the first inverter to prevent electrical overstress of the first inverter;
a first voltage level pull-up circuit pulling up voltage level of the input signal inputted into the first inverter;
an input stage circuit receiving the first control signal to generate a corresponding digital signal inputted into a core circuit; and
a logic calibration circuit for calibrating voltage level of the first control signal when the first inverter mis-operating due to the input signal having a low voltage level.

19. The mixed-voltage I/O buffer as claimed in claim 18, wherein the floating N-well circuit further comprises:
a third P-type transistor coupled to the I/O pad and the N-well of the first P-type transistor and turned on in accordance with a result of logical operation of an enable signal, a determining signal and an output signal, such that the voltage of the I/O pad is provided for the N-well of the first P-type transistor.

20. The mixed-voltage I/O buffer as claimed in claim 19, wherein the floating N-well circuit further comprises:
a fourth P-type transistor coupled to the N-well of the first P-type transistor; and
a fifth P-type transistor stack-connected with the fourth P-type transistor and turned on in the receiving mode to bias the N-well of the first P-type transistor at a power voltage through a parasitic diode of the fourth P-type transistor.

21. The mixed-voltage I/O buffer as claimed in claim 20, wherein the floating N-well circuit further comprises:

a logic circuit capable of performing NAND operation of the enable signal, the determining signal and the output signal, the logic circuit having an output coupled to the fourth P-type transistor and coupled to the fifth P-type transistor through a second inverter.

22. The mixed-voltage I/O buffer as claimed in claim 18, wherein the floating N-well circuit further comprises:
a sixth P-type transistor coupled to the I/O pad and the N-well of the second P-type transistor and turned on when the I/O pad having a high voltage, such that the voltage of the I/O pad is provided for the N-well of the second P-type transistor.

23. The mixed-voltage I/O buffer as claimed in claim 22, wherein the floating N-well circuit further comprises:
a seventh P-type transistor coupled to the N-well of the second P-type transistor, the N-well of the second P-type transistor being biased at a power voltage through a parasitic diode of the seventh P-type transistor in the receiving mode.

24. The mixed-voltage I/O buffer as claimed in claim 18, wherein the dynamic driving detecting circuit further comprises:
an eighth P-type transistor having a gate receiving the determining signal and a source coupled to a power voltage and turned on by the determining signal when the I/O power supply being at a high voltage such that the power voltage is output through the eighth P-type transistor to be the first gate bias.

25. The mixed-voltage I/O buffer as claimed in claim 24, wherein the dynamic driving detecting circuit further comprises:
a ninth P-type transistor coupled to the I/O power supply and turned on in accordance with the determining signal when the I/O power supply being less than or equal to the power voltage such that the I/O power supply is output through the ninth P-type transistor to be the first gate bias.

26. The mixed-voltage I/O buffer as claimed in claim 25, wherein the dynamic driving detecting circuit further comprises:
a third inverter having an input receiving the determining signal; and
a third N-type transistor having a gate coupled to the power voltage, a drain coupled to an output of the third inverter, and a source coupled to a gate of the ninth P-type transistor.

27. The mixed-voltage I/O buffer as claimed in claim 26, wherein the dynamic driving detecting circuit further comprises:
a tenth P-type transistor having a gate coupled to the power voltage, a source coupled to the I/O power supply, and a drain coupled to the gate of the ninth P-type transistor.

28. The mixed-voltage I/O buffer as claimed in claim 25, wherein the dynamic driving detecting circuit further comprises:
a fourth inverter having an input receiving a first logic signal of the logic signals; and
a CMOS circuit having an input coupled to an output of the fourth inverter and an output for outputting the first gate bias, the CMOS circuit comprising a pull-up transistor having a source coupled to drains of the ninth P-type transistor and the eighth P-type transistor.

29. The mixed-voltage I/O buffer as claimed in claim 18, wherein the dynamic gate bias generator further comprises:
a voltage level converting circuit receiving a low-power bias and the determining signal and outputting complementary signals having corresponding voltage levels to the power supply by converting voltage levels of a second logic signal of the logic signals.

30. The mixed-voltage I/O buffer as claimed in claim 29, wherein the dynamic gate bias generator further comprises:
a logic switch converting circuit for providing a second gate bias for the first P-type transistor in accordance with voltage levels of the I/O power supply.

31. The mixed-voltage I/O buffer as claimed in claim 29, wherein the dynamic gate bias generator further comprises:
a low-power bias circuit for providing the low-power bias for the voltage level converting circuit.

32. The mixed-voltage I/O buffer as claimed in claim 18, wherein the logic calibration circuit further comprises:
a fifth inverter for inverting the input signal to generate a second control signal; and
a pull-down calibration circuit controlled by the input signal and the second control signal and pulling down voltage level of the first control signal when the first inverter mis-operating due to the input signal having the low voltage level.

33. The mixed-voltage I/O buffer as claimed in claim 32, wherein the pull-down calibration circuit further comprises:
a fourth N-type transistor having a gate receiving the input signal and a drain coupled to the first inverter to receive the first control signal; and
a fifth N-type transistor having a gate receiving the second control signal, a drain coupled to a source of the fourth N-type transistor, and a source coupled to a ground voltage.

34. The mixed-voltage I/O buffer as claimed in claim 33, wherein the voltage level of the first control signal is pulled down to the ground voltage when the fourth N-type transistor is turned on by the input signal having the low voltage level and the fifth N-type transistor is turned on by the second control signal.

35. The mixed-voltage I/O buffer as claimed in claim 32, wherein the logic calibration circuit further comprises:
a second voltage level limiting circuit for limiting voltage level of the external signal to generate the input signal transmitted to the fifth inverter to prevent electrical overstress of the fifth inverter.

36. The mixed-voltage I/O buffer as claimed in claim 35, wherein the second voltage level limiting circuit is activated by an enable signal in the receiving mode.

37. The mixed-voltage I/O buffer as claimed in claim 32, wherein the logic calibration circuit further comprises:
a second voltage level pull-up circuit pulling up voltage level of the input signal inputted into the fifth inverter.

38. The mixed-voltage I/O buffer as claimed in claim 18, wherein first voltage level limiting circuit is activated by an enable signal in the receiving mode.

39. The mixed-voltage I/O buffer as claimed in claim 18, wherein the input stage circuit is a sixth inverter.

40. The mixed-voltage I/O buffer as claimed in claim 18, wherein the dynamic gate bias generator generates the bias voltages to bias gates of the stacked pull-up P-type transistors to prevent electrical overstress.

41. The mixed-voltage I/O buffer as claimed in claim 18, wherein the output buffer circuit further comprises:
a pre-driving circuit outputting the logic signals to the dynamic gate bias generator by receiving an enable signal.

42. The mixed-voltage I/O buffer as claimed in claim 18, wherein the output buffer circuit further comprises:
an electrostatic discharge (ESD) protection circuit releasing ESD current when turned on.

\* \* \* \* \*